(12) United States Patent
Cotte et al.

(10) Patent No.: US 6,346,484 B1
(45) Date of Patent: Feb. 12, 2002

(54) METHOD FOR SELECTIVE EXTRACTION OF SACRIFICIAL PLACE-HOLDING MATERIAL USED IN FABRICATION OF AIR GAP-CONTAINING INTERCONNECT STRUCTURES

(75) Inventors: John Michael Cotte, New Fairfield, CT (US); Christopher Vincent Jahnes, Upper Saddle River, NJ (US); Kenneth John McCullough, Fishkill, NY (US); Wayne Martin Moreau, Wappinger, NY (US); Satyanarayana Venkata Nitta, Fishkill, NY (US); Katherine Lynn Saenger, Ossinger, NY (US); John Patrick Simons, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/651,843

(22) Filed: Aug. 31, 2000

(51) Int. Cl.[7] ............................................ H01C 21/302
(52) U.S. Cl. ...................................... 438/725; 438/623
(58) Field of Search ................................ 438/725, 623

(56) References Cited

U.S. PATENT DOCUMENTS

| 5,461,003 A | | 10/1995 | Havenmann et al. ........ 438/666 |
| 5,559,055 A | | 9/1996 | Chang et al. ................ 438/586 |
| 5,869,880 A | | 2/1999 | Grill et al. ................... 257/522 |
| 5,908,510 A | | 6/1999 | McCullough et al. .......... 134/2 |
| 5,981,354 A | * | 11/1999 | Spikes et al. ................ 438/424 |
| 6,265,321 B1 | * | 7/2001 | Chooi et al. ................. 438/725 |

* cited by examiner

Primary Examiner—Charles Bowers
Assistant Examiner—William M. Brewster
(74) Attorney, Agent, or Firm—Scully, Scott, Murphy & Presser; Robert M. Trepp, Esq.

(57) ABSTRACT

The present invention relates to formation of air gaps in metal/insulator interconnect structures, and to the use of supercritical fluid (SCF)-based methods to extract sacrificial place-holding materials to form air gaps in a structure. Supercritical fluids have gas-like diffusivities and viscosities, and very low or zero surface tension, so SCF's can penetrate small access holes and/or pores in a perforated or porous bridge layer to reach the sacrificial material. Examples of SCFs include $CO_2$ (with or without cosolvents or additives) and ethylene (with or without cosolvents or additives). In a more general embodiment, SCF-based methods for forming at least partially enclosed air gaps in structures that are not interconnect structures are disclosed.

12 Claims, 3 Drawing Sheets

METHOD FOR SELECTIVE EXTRACTION OF SACRIFICIAL PLACE-HOLDING MATERIAL USED IN FABRICATION OF AIR GAP-CONTAINING INTERCONNECT STRUCTURES

FIELD OF THE INVENTION

The present invention relates to semiconductor device manufacturing, and more particularly to methods for forming air gap-containing metal/insulator interconnect structures for Very Large Scale Integrated (VLSI) and Ultra-Large Scale Integrated (ULSI) devices and packaging, wherein the air gaps are formed in such structures by removing sacrificial place-holder materials from predefined cavities using supercritical fluid (SCF)-based extraction processes.

BACKGROUND OF THE INVENTION

Device interconnections in Very Large Scale Integrated (VLSI) or Ultra-Large Scale Integrated (ULSI) semiconductor chips are typically effected by multilevel interconnect structures containing patterns of metal wiring layers called traces. Wiring structures within a given trace or level of wiring are separated by an interlevel dielectric, while the individual wiring levels are separated from each other by layers of an interlevel dielectric. Conductive vias are formed in the interlevel dielectric to provide interlevel contacts between the wiring traces.

By means of their effects on signal propagation delays, the materials and layout of the interconnect structures can substantially impact chip speed, and thus chip performance. Signal propagation delays are due to RC time constants, wherein 'R' is the resistance of the on-chip wiring, and 'C' is the effective capacitance between the signal lines and the surrounding conductors in the multilevel interconnection stack. RC time constants can be reduced by lowering the specific resistance of the wiring material, and by using interlevel and intralevel dielectrics (ILDs) with lower dielectric constants, k.

One highly preferred metal/dielectric combination for low RC interconnect structures is copper, i.e., Cu, metal with a dielectric such as $SiO_2$ (k~4.0). Due to difficulties in subtractively patterning copper, copper-containing interconnect structures are typically fabricated by a damascene process.

In a typical damascene process, metal patterns inset in a dielectric layer are formed by the steps of: (i) etching holes (for vias) or trenches (for wiring) into the interlevel or intralevel dielectric; (ii) optionally, lining the holes or trenches with one or more adhesion or diffusion barrier layers; (iii) overfilling the holes or trenches with a metal wiring material; and (iv) removing the metal overfill by a planarizing process such as chemical-mechanical polishing (CMP), leaving the metal wiring material even with the upper surface of the dielectric. These processing steps can be repeated until the desired number of wiring and via levels have been fabricated.

Low-k alternatives to $SiO_2$ include carbon-based solid materials such as diamond-like carbon (DLC), also known as amorphous hydrogenated carbon (a-C:H), fluorinated DLC (FDLC), SiCO or SiCOH compounds, and organic or inorganic polymer dielectrics. Nanoporous versions of $SiO_2$ and the above-mentioned carbon-based materials have even lower k values, while air gaps have the lowest k values of any material (k of about 1.0). (Note that the air in the air gap may comprise any gaseous material or vacuum.)

Examples of multilayer interconnect structures incorporating air gaps are described, for example, in U.S. Pat. No. 5,461,003 to Havemann, et al.; U.S. Pat. No. 5,869,880 to A. Grill, et al.; and U.S. Pat. No. 5,559,055 to Chang, et al.

Air gaps in interconnect structures are most commonly formed by using a sacrificial-place-holder (SPH) material which is removed or extracted from beneath a permeable or perforated bridge layer to leave behind a cavity that defines the air gap. The exact method by which the sacrificial material is removed depends on: (i) the type of sacrificial material employed; (ii) the other materials in the structure to which the SPH removal process must be selective; and (iii) the geometry employed for the bridge layer. Examples of materials that may be utilized as SPHs include:

poly(methylmethacrylate) (PMMA) and parylene (e.g., poly-para-xylylene sold under the trademark "Paralylene") which may be removed by organic solvents, oxygen ashing, and/or low temperature (~200° C.) oxidation, and norborene-based materials such as BF Goodrich's Unity Sacrificial Polymer™, which may be removed by low temperature (350°–400° C.) thermal decomposition into volatile by-products.

In the case of the Unity™ material, the volatile decomposition by-products may diffuse through a solid bridge layer, as demonstrated by Kohl, et al., Electrochemical and Solid-State Letters 1 49 (1998), for structures comprising $SiO_2$(500 nm) bridge layers deposited by low temperatureeplasma-enhanced chemical vapor deposition (PECVD). Other prior art approaches utilize bridge layers containing perforations or access holes through which the SPH materials may be dissolved, etched and/or volatilized.

FIGS. 1A–1B and 2A–C illustrate, in cross-sectional view, two prior art extraction methods that are typically employed in forming air gaps. Specifically, FIGS. 1A–1B show creation of an air gap in a cavity bounded by substrate 10, conductive material 20, and permeable dielectric bridge layer 30. Upon heating, SPH material 40 in FIG. 1A forms volatile decomposition products which diffuse through bridge layer 30 to form air gap 50 of FIG. 1B.

FIGS. 2A–2C show air gap creation in a structure containing a perforated bridge layer 60, with perforation 70. SPH material 40 in FIG. 2A is removed from the structure of FIG. 2B with air gap 80 by a process such as plasma-etching in a reactive gas. Perforation 70 may then be pinched-off by depositing dielectric layer 90 to form the structure of FIG. 2C.

While the above-mentioned prior art extraction methods may work in principle, reduction to practice is often difficult. For instance, bridge layers may crack or blister if SPH volatilization is too fast; and SPH removal may be inefficient and/or incomplete for SPH material not in the immediate vicinity of a bridge layer perforation. Incomplete removal is a particular concern for plasma-based removal processes, in which the active radical species may become deactivated before reaching recessed SPH residuals. In addition, oxygen-based removal processes (e.g., thermal and/or plasma) may attack the conductive wiring materials. These problems can be exacerbated by the fact that the holes or perforations in a bridge layer are preferably small, with relatively high aspect ratios, to facilitate the "pinch-off" deposition processes used to seal the holes. The term "high aspect ratio", as used herein, denotes a hole whose height to width ratio is greater than 1.0. Small holes are a particular problem for solvent-based wet removal processes, because surface tension effects prevent effective solvent penetration.

In view of the drawbacks mentioned hereinabove concerning prior art extraction methods, there is a continued need for developing a new and improved method for fabricating air gaps in interconnect structures.

SUMMARY OF THE INVENTION

One object of the present invention is to provide an improved method for extracting SPH materials whose removal is required to form air gaps in interconnect structures.

A further object of the present invention is to provide a method for extracting SPH materials that is reliable, manufacturable, highly selective (so as not to damage the non-extractable components of the interconnect structure), environmentally benign, and scalable to increasingly remote cavities and increasingly smaller perforations (or access holes) in the bridge layer.

An additional object of the present invention is to provide a method for extracting SPH materials from cavities that are not necessarily in interconnect structures, such as cavities in micromechanical devices or in other microelectronic devices.

These and other objects and advantages are achieved in the present invention by employing supercritical fluid (SCF)-based methods to extract sacrificial place-holding materials whose removal is required to form air gaps in interconnect structures. Specifically, the present invention is directed to a method of forming an at least partially enclosed air gap in a structure comprising the steps of:

(a) forming a structure on a substrate, said structure including one or more 3-dimensional regions containing a sacrificial material, dimensions of said regions enclosed by a collection of solid surfaces including a top surface wherein at least one of said surfaces contains at least one opening through which said sacrificial material may be removed, and (b) removing said sacrificial material by use of a supercritical fluid to form said at least partially enclosed air gap.

As is known to one skilled in the art, supercritical fluids have gas-like diffusivities and viscosities, and very low or zero surface tension, so supercritical fluids can penetrate small access holes and/or pores in a perforated or porous bridge layer to reach the sacrificial material. An example of a SCF that may be employed in the present invention is $CO_2$ (with or without cosolvents or additives). Selectivity (i.e., extraction of the SPH material without damage to the other materials remaining in the structure) is nearly assured with respect to the conductive materials of the structure which are typically metals and inorganic materials. Selectivity with respect to the dielectrics remaining in the structure is provided by the appropriate choice of the SPH, inter/intralevel dielectrics, and bridge layer materials.

As described by P. Gallagher-Wetmore, et al., Proc. SPIE 2438 694 (1995) and Proc. SPIE 2725 289 (1996), supercritical fluid phenomena were first reported over 100 years ago (J. B. Hanny and J. Hogarth, Proc. R. Soc. London 29 324 (1879)) and have evolved from a laboratory curiosity to a mainstream technique for materials separation in industries such as foods, polymers, and pharmaceuticals. The need for environmentally benign methods to clean textiles and precision parts without the use of conventional organic solvents has also revived interest in SCF methods.

While SCF-based methods have been previously used in the semiconductor industry for resist development and surface-tension-free drying, SCF-based methods have never been used for extracting or removing a sacrificial material from under a bridge layer to create a cavity. In the area of resist technology, SCF-based methods are used to remove the exposed or unexposed regions of a resist to form a patterned resist layer. Moreover, the zero surface tension of SCFs allows the SCF to penetrate sub-micron patterns in intricate geometries.

More importantly, SCF makes it possible to form high aspect ratio resist features that do not collapse onto one another from the surface tension forces that would be encountered with conventional liquid developers. This same feature of SCF processing has also been exploited to increase the yield of micromechanical devices such as cantilevered beams and microengines; the structures are dried with SCF $CO_2$ after the release etch to avoid breakage due to surface tension forces (See, C. W. Dyck, et al., Proc. SPIE 2879 225 (1996)).

BRIEF DESCRIPTION OF THE DRAWINGS

These and other features, objects, and advantages of the present invention will become apparent upon a consideration of the following detailed description of the invention when read in conjunction with the drawings, in which.

DESCRIPTION OF THE PREFERRED EMBODIMENTS

Figure 1A:
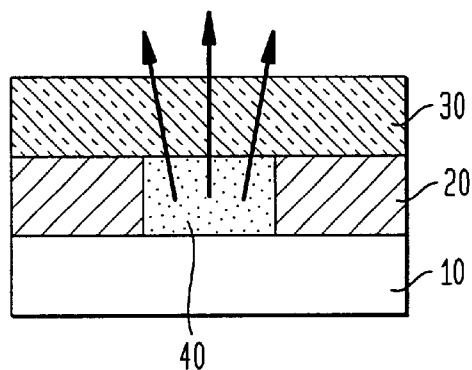
FIGS. 1A–1B show cross section views of a first prior art extraction method for forming air gaps.
Figure 1B:
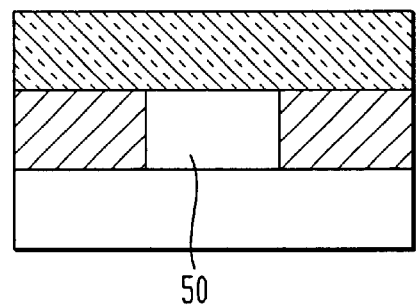
Figure 2A:
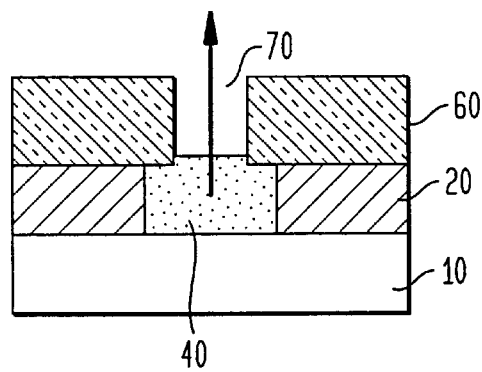
FIGS. 2A–2C show cross section views of a second prior art extraction method for forming air gaps.
Figure 2B:
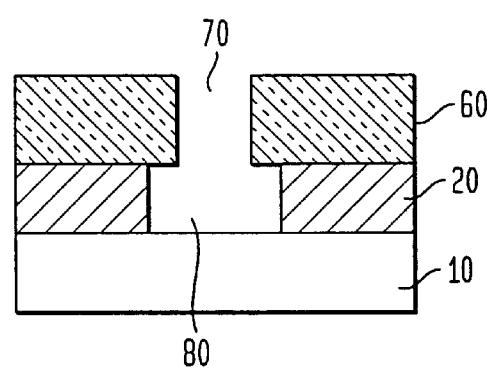
Figure 2C:
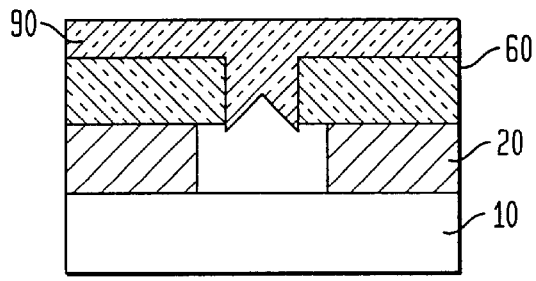

The present invention which relates to a method of forming an air gap-containing interconnect structure using SCF-based methods will now be described in more detail by referring to the drawings that accompany the present application.

Figure 3A:
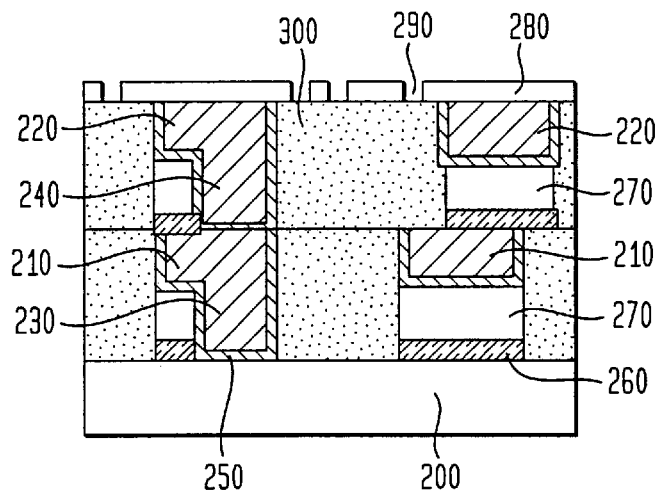
FIGS. 3A–3C show, in cross section view, an exemplary interconnect structure of the present invention at three stages in processing: before SPH extraction (FIG. 3A), after SPH extraction (FIG. 3B), and after processing is complete (FIG. 3C)
Figure 3B:
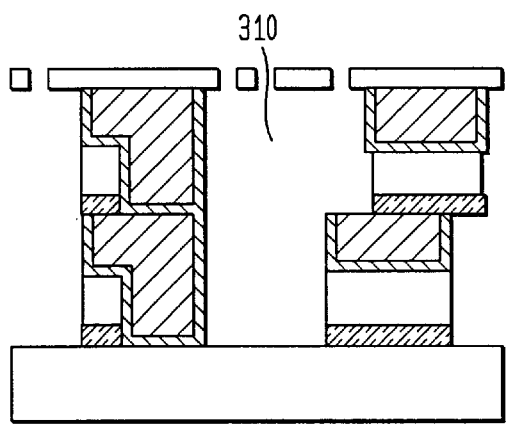
Figure 3C:
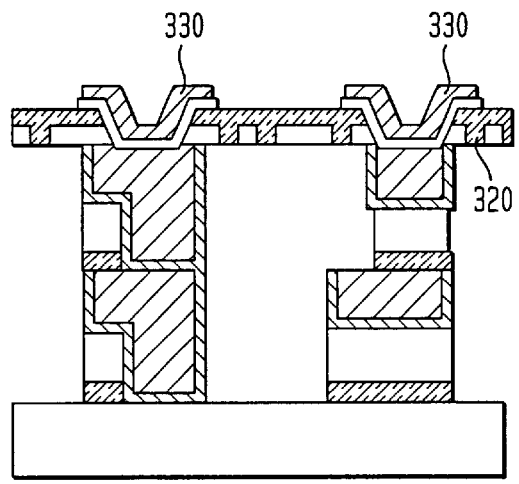

Reference is made to FIGS. 3A–3C which show, in cross section view, an exemplary interconnect structure at three stages in processing. Specifically, the interconnect structure of FIGS. 3A–3C comprises substrate 200, a lower (210) and upper (220) level of conductive wiring, lower (230) and upper (240) conductive vias, and conductive liner/barrier materials 250. Dielectrics in the structure include optional dielectric barrier materials 260, permanent via level dielectrics 270, and perforated bridge layer 280 with perforations 290. SPH material 300 in FIG. 3A fills the regions of the structure where air gaps are desired, and is extracted by the methods of the present invention to produce the structure of FIG. 3B with air gap 310. FIG. 3C shows the structure after perforated bridge layer 280 has been sealed by pinching-off with dielectric layer 320, and patterned with contacts 330.

It should be noted that perforations 290 may alternatively be sealed off by methods that do not require the deposition of a separate "pinch-off" layer. For example, perforations 290 may be induced to self-seal during the application of heat, immersion in plasma, e-beam irradiation, UV irradiation, and/or laser irradiation. Alternatively, "pinch-off" layer 320 may be disposed in a selective manner so that the material of "pinch-off" layer 320 preferentially plugs perforations 290 rather than accumulating over bridge layer 280.

While FIGS. 3A–3C show a two-wiring level interconnect structure with a particular number of wiring and via levels, and a particular arrangement of dielectrics and conductive materials, it is noted that the interconnect structure shown is merely exemplary, and that the interconnect structures in which air gaps may be created by the methods of the present invention may comprise any number of via and wiring levels, and any arrangement of dielectric and conductive materials. Likewise, it is also noted that contents of air gap 310 may contain Ar, $O_2$, $N_2$. He, $SF_6$, $CF_4$, other gases, vacuum, and/or mixtures thereof.

Perforated bridge layer 280 in FIGS. 3A–3C may be replaced by a solid, non-perforated bridge layer of a porous material (not shown). This saves the steps of lithographically defining and etching perforations 290, as well as the step of pinching-off perforations 290. If desired, the porous bridge layer may be sealed after extraction, for example, by depositing a thin sealing layer to clog up a surface layer of pores.

The air gap shown in FIGS. 3A–3C is formed utilizing any conventional method in which a SCF is generated. A preferred SCF employed herein in creating the air gaps is $CO_2$. Other SCFs that can be employed in the present invention include ethylene. A typical SCF extraction process that may be employed herein is carried out as follows: the workpiece containing the material to be extracted is introduced to an extraction chamber along with the SCF at a high pressure (for example, greater than 100 atm) and a first elevated temperature; the material to be extracted is dissolved in the SCF to form a solute plus SCF solution; the solute and SCF solution is transferred to a separator chamber at a lower pressure and a less elevated temperature where the solute precipitates out; and the solute-free SCF is repressurized and recycled back to the extraction chamber where the process is repeated until the extraction is sufficiently complete. Exemplary high pressure/temperature and low pressure/temperature conditions for SCF $CO_2$ dissolution of naphthalene is 300 atm/55° C. and 90 atm/32° C.

An important difference between the SCF extraction process of the present invention and prior art SCF-based cleaning processes is that the SPH material of the present invention may be selected or even specifically designed for optimum compatibility with SCF extraction methods, ensuring that SCF extraction methods will work. For example, a SPH material may be selected for an especially high solubility in a particular SCF or SCFcosolvent combination, e.g., SCF $CO_2$. In contrast, one typically has very little control over the composition and chemical properties of the residues that must be removed in the cleaning process, so that SCF-based cleaning processes may not universally work with every type of residue.

The SPH materials employed in the present invention are preferably selected to have thermal stabilities sufficient to withstand pre-extraction processing steps performed at elevated temperatures, such as dielectric depositions at 300°–400° C. SPH materials with less thermal stability may also be acceptable, but would typically require modified dielectric deposition steps performed at lower temperatures (e.g., 50°–200° C.). In addition, it is preferred that SCF-induced swelling of SPH materials be minimal, so that the pressure/forces exerted during the dissolution/extraction do not damage the structure (e.g., produce bridge layer rupture).

Several silsesquioxane (SSQ)-based materials are expected to have both the desired thermal stability and the desired solubility in SCF-$CO_2$. In particular, polyalkyl and polyarylsilsequixanes described in U.S. Pat. Nos. 4,626,556 and 4,745,169, the contents of which are incorporated herein by reference, are a general class of ladder-type siloxane polymers which are expected to be soluble in SCF $CO_2$. GR 950 Glass Resin R sold by Owens Illinois is a version of a polyalkylsilsesquioxane ladder-commercialized by Allied as a spin-on-glass resin.

Figure 4A:
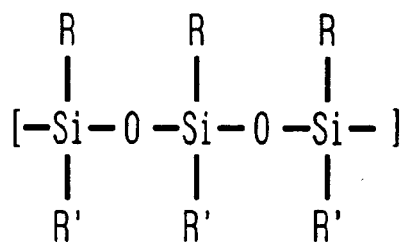
FIGS. 4A–B show chemical diagrams of some preferred SCF-soluble materials expected to be useful for the method of the present invention.
Figure 4B:
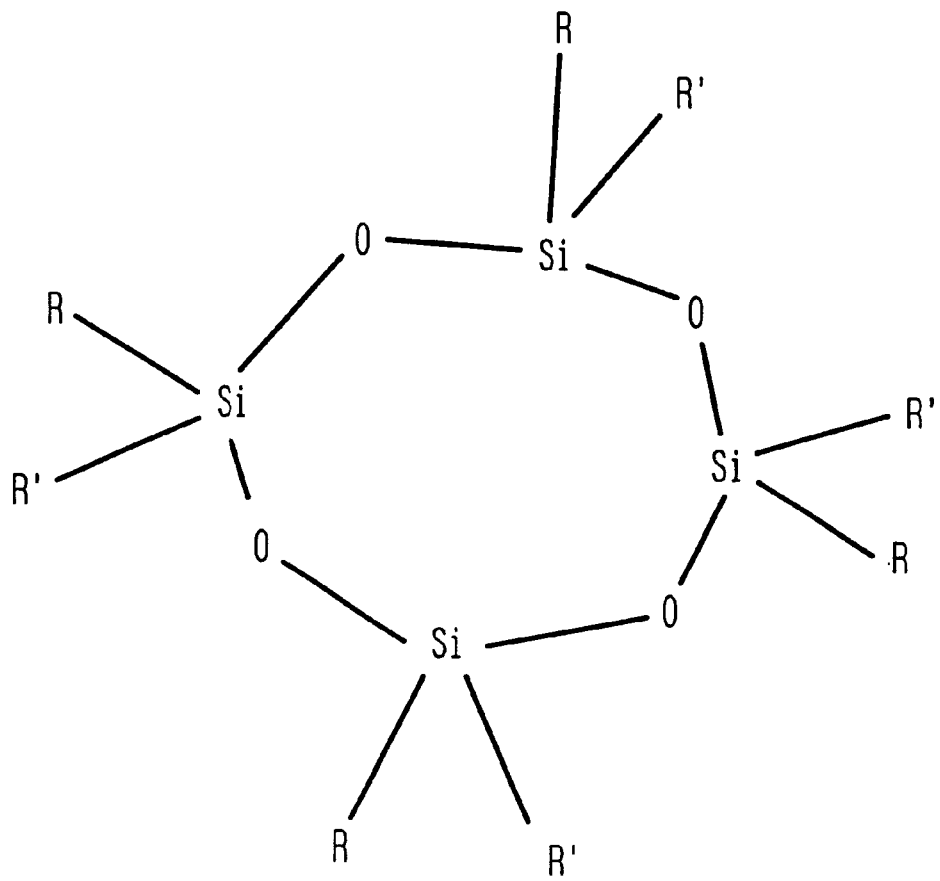

FIGS. 4A–4B shows generic molecular structures for these ladder-type siloxane polymer compounds, where each R and RI may be the same or different, and may be selected from the group consisting of H, alkyls, aryls and substituted aryl derivatives. The Si—O "ladder" in FIG. 4A is linear, whereas the Si—O "cage ladder" in FIG. 4B is ring-like. Some phenyl-based-SSQ (PHBS) materials and various porous hydrogen and/or alkyl-based SSQs appear to be especially promising. It should also be noted that the SPH material may also comprise photosensitive versions of these and other SCF-soluble materials.

Other materials with the desired solubility in SCF-$CO_2$ are expected to be less thermally stable, but are still considered promising candidates for SPH materials. This group includes styrenes and methacrylates chemically modified by fluorination and/or copolymerization, as well as siloxane copolymers and siloxane modified methacrylate, (see, for example, Gallagher-Wetmore, et al., Proc. SPIE 2438 694 (1995)).

Cosolvents may be introduced into the SCF to enhance the solubility of the sacrificial material. The preferred cosolvent will depend on the properties of the SPH. For example, a preferred cosolvent for SCF $CO_2$ extraction of a SPH material of HSQ (hydrogen silsesquoxane) might be monoethanolamine. The use of cosolvents greatly widens the choice of SCF-soluble SPH materials, but requires additional care in evaluating the selectivity of the extraction with respect to the materials which are to remain in the structure.

While the present invention has been described in an illustrative manner, it should be understood that the terminology used is intended to be in a nature of words of description rather than of limitation. Furthermore, while the present invention has been described in terms of several preferred embodiments, it is to be appreciated that those skilled in the art will readily apply these teachings to other possible variations of the inventions For example, while the present invention has been described for the specific case of using SCF-based extraction methods to form air gaps in interconnect structures, the invention also covers a general method for forming an at least partially enclosed air gap comprising the steps of:

selecting a substrate;

selecting a sacrificial material;

forming on said substrate a structure containing one or more 3-dimensional regions containing said sacrificial material, dimensions of said regions enclosed by a collection of solid surfaces including a top surface, wherein at least one of said surfaces contains at least one opening through which the sacrificial material may be removed; and removing said sacrificial material with the use of a supercritical fluid to form said at least partially enclosed air gap.

As in the previous example describing the formation of air gaps in interconnect structures, the at least one opening may comprise one of more pores, or comprise one or more lithographically defined perforations; these pores or perforations may be subsequently sealed, as desired, and the contents of the air gap may comprise Ar, $O_2$, $N_2$, He, $CO_2$, $SF_6$, $CF_4$, other gases, vacuum, or mixtures thereof.

What we claim as new, and desire to secure by the Letters Patent is:

1. A method of forming one or more at least partially enclosed air gaps comprising the steps of:
   (a) forming a structure on a substrate, said structure including one or more 3-dimensional regions containing a sacrificial material, dimensions of said regions enclosed by a collection of solid surfaces including a top surface wherein at least one of said surfaces contains at least one opening through which said sacrificial material may be removed, and
   (b) removing said sacrificial material by use of a supercritical fluid to form said one or more at least partially enclosed air gaps.

2. The method of claim 1 further comprising (c) sealing said at least one of said openings.

3. The method of claim 1 wherein said at least one opening takes the form of a pore.

4. The method of claim 1 wherein said at least one of said openings is in a dielectric bridge layer and is a lithographically defined hole or perforation that is formed by etching.

5. The method of claim 1 wherein said supercritical fluid is a single component substance.

6. The method of claim 5 wherein said single component substance is selected from the group consisting of $CO_2$ and ethylene.

7. The method of claim 1 wherein said supercritical fluid further includes one or more cosolvents.

8. The method of claim 7 wherein said one or more cosolvents is monoethanolamine.

9. The method of claim 1 wherein said sacrificial material is selected from the group consisting of silsesquioxane (SSQ)-based materials; ladder-type siloxane polymers with R and R groups attached to one or more Si atoms where R and R are the same or different and are H, alkyls, aryls, substituted aryl or derivatives; siloxane copolymers; styrenes-and/or methacrylate chemically modified by fluorination and/or copolymerization; siloxane modified methacrylate; photosensitive formulations of the aforementioned materials; and any porous versions of the aforementioned materials.

10. The method of claim 9 wherein said SSQ-based materials are hydrogen silsequioxanes, polyalkylsilsequioxanes or polyarylsilsequioxanes.

11. The method of claim 1 wherein contents of said at least particularly enclosed air gap comprises Ar, $O_2$, $N_2$, He, $CO_2$, $SF_6$, $CF_4$, other gases, vacuum, or mixtures thereof.

12. The method of claim 1 wherein said at least one or more at least partially enclosed air gaps are formed in an interconnect structure.

* * * * *